(12) United States Patent
Yu

(10) Patent No.: US 8,198,938 B2
(45) Date of Patent: Jun. 12, 2012

(54) BROADBAND POWER AMPLIFIER

(75) Inventor: Daekyu Yu, Seoul (KR)

(73) Assignee: Wipam, Inc., Gyeonggi-Do (KR)

( * ) Notice: Subject to any disclaimer, the term of this patent is extended or adjusted under 35 U.S.C. 154(b) by 0 days.

(21) Appl. No.: 12/656,603

(22) Filed: Feb. 4, 2010

(65) Prior Publication Data

US 2010/0141338 A1  Jun. 10, 2010

Related U.S. Application Data

(63) Continuation of application No. PCT/KR2008/004518, filed on Aug. 4, 2008.

(30) Foreign Application Priority Data

Aug. 6, 2007 (KR) .................. 10-2007-0078658

(51) Int. Cl.
  *H03F 3/68* (2006.01)
(52) U.S. Cl. .................. 330/124 R; 330/295
(58) Field of Classification Search .............. 330/124 R, 330/295
  See application file for complete search history.

(56) References Cited

U.S. PATENT DOCUMENTS

| 6,285,251 | B1 | 9/2001 | Dent et al. | |
|---|---|---|---|---|
| 6,317,002 | B1 | 11/2001 | Griffiths | |
| 6,617,929 | B2 * | 9/2003 | Yi et al. | 330/295 |
| 7,135,931 | B2 * | 11/2006 | Prodanov | 330/302 |
| 7,342,444 | B2 * | 3/2008 | Kim et al. | 330/124 R |
| 7,589,588 | B2 * | 9/2009 | Ohnishi et al. | 330/51 |
| 2005/0231278 | A1 | 10/2005 | Blednov | |
| 2009/0206926 | A1 | 8/2009 | Horiguchi et al. | |

FOREIGN PATENT DOCUMENTS

| JP | 7-22852 | 1/1995 |
|---|---|---|
| JP | 8-330873 | 12/1996 |
| JP | 2005-130013 | 5/2005 |
| JP | 2005-536922 | 12/2005 |
| JP | 2006-129482 | 5/2006 |
| JP | 2006-166141 | 6/2006 |
| JP | 2006-332829 | 12/2006 |
| JP | 2006-339981 | 12/2006 |
| KR | 10-2002-0074630 | 10/2002 |
| KR | 10-2005-0031663 | 4/2005 |
| WO | WO 9847222 | 10/1998 |
| WO | 2007/015462 | 2/2007 |

OTHER PUBLICATIONS

"Series and Parallel Resistors", Calvin College, 2000.*
Mordehai Heiblum et al., "Construction of a dynamic load line", Physics Education, Institute of Physics Publishing, Bristol, GB, vol. 15, No. 2, Mar. 1, 1980, pp. 122-124.

(Continued)

*Primary Examiner* — Robert Pascal
*Assistant Examiner* — Khiem Nguyen
(74) *Attorney, Agent, or Firm* — Bacon & Thomas, PLLC

(57) ABSTRACT

A broadband power amplifier is embodied by realizing a substantially two-section output matching circuit or a substantially two-section input matching circuit using a quarter wave transformer itself as the input matching circuit or the output matching circuit. The broadband power amplifier is advantageous in view of integration and miniaturization due to the low characteristic impedance of the quarter wave transformer and enables both reduction of sizes of chips and circuits due to its simple circuit structure and reduction in cost due to the reduced number of passive devices.

13 Claims, 8 Drawing Sheets

OTHER PUBLICATIONS

Daekyu Yu et al., "Fully Integrated Doherty Power Amplifiers for 5 GHz Wireless-LANs", Radio Frequency Integrated Circuits (RFIC) Symposium 2006, IEEE, Jun. 11, 2006.

Gunhyun Ahn et al., "Design of a High-Efficiency and High-Power Inverted Doherty Amplifier", IEEE Transactions on Microwave Theory and Techniques, vol. 55, No. 6, Jun. 2007, pp. 1105-1111.

European Search Report corresponding to European Application No. EP 08 79 3032 dated Nov. 25, 2010.

Japanese Office Action for Application No. 2010-519857 dated May 31, 2011.

* cited by examiner

_US 8,198,938 B2_

BROADBAND POWER AMPLIFIER

This application is a Continuation Application of PCT International Application No. PCT/KR2008/004518 filed on Aug. 4, 2008, which designated the United States.

FIELD OF THE INVENTION

The present invention generally relates to a broadband power amplifier and, more particularly, to a broadband power amplifier employing a simple circuit structure while having broadband characteristics and being advantageous in view of integration and miniaturization.

BACKGROUND OF THE INVENTION

In recent years, due to miniaturization and multi-functionality of mobile communication terminals, relays, and base stations, many studies on improvement in the efficiencies of RF power amplifiers that consume almost all consumption power are being carried out in an effort to increase battery time, and, among them, studies on Doherty power amplifier, which is representative of solution for increasing efficiency of a RF power amplifier, are mainly carried out.

The Doherty amplifier was provided by W. H. Doherty in 1936, in which a carrier amplifier and a peaking amplifier are connected in parallel to each other using a quarter wave transformer ($\lambda/4$ line). The Doherty amplifier varies the amount of current supplied to a load by the peaking amplifier according to power level to control the load line impedance of a carrier amplifier, thereby increasing efficiency thereof.

A Doherty power amplifier for used in a handset, i.e. a Doherty amplifier for a mobile communication terminal according to the prior art replaces a quarter wave transformer by a circuit such as a $\pi$-network including an inductor L and a capacitor C. Input matching circuits are connected to input terminals of the carrier amplifier and the peaking amplifier, and output matching circuits are connected to output terminals of the carrier amplifier and the peaking amplifier.

In realization of Doherty power amplifiers for mobile communication terminals, due to increased importance of their size, they are needed to be miniaturized, in which case the Doherty amplifiers are being realized on PCB packages due to their sizes and inductor losses in spite of their needs for integration on chips.

In order to widen the bandwidth of a frequency and obtain broadband characteristics, reference impedance is generally matched to desired impedance through a matching circuit conventionally including two or three inductors, a capacitor, and/or a micro-strip line. In this case, the circuit structure becomes complex as the number of matching circuits increases, causing the sizes of chips and circuits to become larger and causing increase in cost owing to additional use of passive devices. Then, as the number of passive devices increases, the matching circuit loss in the entire circuit increases due to loss in the passive devices, thereby causing lowering of the efficiency of the circuit.

FIG. 1 is a circuit diagram illustrating the first example of a Doherty power amplifier according to the prior art, and FIG. 2 is a circuit diagram illustrating an example of widening the bandwidth of a frequency of the Doherty power amplifier in FIG. 1. The reference numeral 11 in FIGS. 1 and 2 denotes a carrier amplifier, the reference numerals 13, 14, 23, and 24, output matching circuits, the reference numeral 15, a micro-strip line, and the reference numeral 21, a peaking amplifier. The micro-strip line 15 functions as a quarter wave transformer. A load impedance $R_L$ and a characteristic impedance $R_0$ do not need to be 50 Ohm and 100 Ohm, respectively, but need to satisfy the condition of $R_0 = R_L \times 2$. FIG. 2 realizes a process of matching the output impedances of the carrier amplifier 11 and the peaking amplifier 21 from the load impedance $R_L$ to an optimum power source impedance $R_{opt}$ of a power device with two-section output matching circuits 13, 14, 23, and 24 to thereby widen the bandwidth of a frequency.

FIG. 3 is a circuit diagram illustrating the second example of a Doherty power amplifier according to the prior art, and FIG. 4 is a circuit diagram illustrating an example of widening the bandwidth of a frequency of the Doherty power amplifier of FIG. 3. In FIGS. 3 and 4, the reference numeral 31 denotes a carrier amplifier, the reference numeral 33, a micro-strip line, the reference numeral 41, a peaking amplifier, the reference numeral 43, an offset line, and the reference numerals 51 and 53, output matching circuits. The Doherty power amplifier of FIG. 3 has a configuration that is advantageous in view of miniaturization and integration by lowering the characteristic impedance of the micro-strip line 33 functioning as a quarter wave transformer, and FIG. 4 represents a structure for widening the bandwidth of a frequency by realizing a process of matching output impedances of the carrier amplifier 31 and the peaking amplifier 41 from a load impedance $R_L$ to an optimum power source impedance $R_{opt}$ of a power device with two-section output matching circuits 51 and 53.

FIG. 5 is a circuit diagram illustrating the third example of a Doherty power amplifier according to the prior art. The reference numeral 61 of FIG. 5 is a carrier amplifier; the reference numerals 63, 73, and 83 are output matching circuits; the reference numeral 65 is a micro-strip line functioning as a quarter wave transformer; the reference numeral 71 is a peaking amplifier; and the reference numeral 75 is an offset line. In FIG. 5, the one-staged output matching circuits 63 and 73 among the two-section output matching circuits 63, 73, and 81 are used for widening the bandwidth of a frequency and are located on the output lines of the carrier amplifier 61 and the peaking amplifier 71. The Doherty power amplifier of FIG. 5 has almost the same characteristics as that of FIG. 4.

The first to third examples of FIG. 2, FIG. 4, and FIG. 5 use two-section output matching circuits to widen the bandwidths of frequencies, thereby obtaining the broadband characteristics, in which case the structures thereof are complex, causing large sizes of chips and circuits, and the matching circuit loss of all the circuits increases due to the losses in passive devices, causing lowering of the efficiencies of the circuits. In particular, the first example of the prior art is vulnerable in integration and miniaturization due to a high characteristic impedance of a micro-strip line functioning as a quarter wave transformer when it is used as a power amplifier for a mobile communication terminal.

Further, even when a Doherty power amplifier is employed on a package of a printed circuit board in order to realize a power amplifier for a mobile communication terminal, the size of the package and the manufacturing cost increase due to the use of several passive devices.

In addition to disadvantages in view of miniaturization of such a power amplifier, the broadband characteristics of a power amplifier may limit the adoption of power amplifiers that are to be used in the next generation mobile communication system.

SUMMARY OF THE INVENTION

It is, therefore, an object of the present invention is to provide a power amplifier that is advantageous in view of integration and miniaturization due to the low characteristic impedance of a quarter wave transformer and has a simple circuit structure while showing the broadband characteristics.

Another object of the present invention is to provide a power amplifier that has a simple circuit structure while showing the broadband characteristics by realizing a substantially two-section input matching circuit using a quarter wave transformer itself as the input matching circuit.

In accordance with an aspect of the present invention, there is provided a broadband power amplifier including: a first amplifier and a second amplifier that are connected in parallel; a first quarter wave transformer connected to an output terminal of the first amplifier to perform an output matching function by controlling a load line impedance of the first amplifier; a second quarter wave transformer connected to an output terminal of the second amplifier to perform an output matching function by controlling a load line impedance of the second amplifier; and an output matching circuit connected to rear ends of the first quarter wave transformer and the second quarter wave transformer.

In accordance with another aspect of the present invention, there is provided a broadband power amplifier including: a first amplifier and a second amplifier that are connected in parallel; a first impedance control line connected in series to an output terminal of the first amplifier; a second impedance control line connected in series to an output terminal of the second amplifier; an output line connecting in parallel output sides of the first impedance control line and the second impedance control line; an output matching circuit located on the output line to match a load impedance to $R_{out}//R_{out}'$ $$\left(\text{where } R_{out}//R_{out}' = \frac{R_{out} \times R_{out}'}{R_{out} + R_{out}'}\right),$$

wherein $R_{out}$ denotes an output impedance of the first impedance control line, and $R_{out}'$ denotes an output impedance of the second impedance control line; a first quarter wave transformer whose characteristic impedance $R_o$ satisfies the condition of $R_{opt}<R_o<R_{out}$ or $R_{opt}>R_o>R_{out}$ is located on the first impedance control line to match the output impedance $R_{out}$ of the first impedance control line to $R_{opt}$, wherein $R_{opt}$ denotes an optimum power source impedance of the carrier amplifier; and a second quarter wave transformer whose characteristic impedance $R_o'$ satisfies the condition of $R_{opt}'<R_o'<R_{out}'$ or $R_{opt}'>R_o'>R_{out}'$ is located on the second impedance control line to match the output impedance $R_{out}'$ of the second impedance line to $R_{opt}'$, wherein $R_{opt}'$ denotes an optimum power source impedance of the peaking amplifier.

In accordance with still another aspect of the present invention, there is provided a broadband power amplifier including: a first amplifier and a second amplifier that are connected in parallel; a first quarter wave transformer connected to an input terminal of the first amplifier to perform an input matching function by controlling an input impedance of the carrier amplifier; a second quarter wave transformer connected to an input terminal of the second amplifier to perform an input matching function by controlling a load line impedance of the carrier amplifier; and an input matching circuit connected to front ends of the first quarter wave transformer and the second quarter wave transformer.

In accordance with yet another aspect of the present invention, there is provided a broadband power amplifier including: a first amplifier and a second amplifier connected in parallel; a first impedance control line connected in series to an input terminal of the first amplifier; a second impedance control line connected in series to an input terminal of the second amplifier; an input line connecting in parallel input sides of the first impedance control line and the second impedance control line; an input matching circuit located on the input line to match an input impedance to $R_{in}//R_{in}'$ $$\left(\text{where } R_{in}//R_{in}' = \frac{R_{in} \times R_{in}'}{R_{in} + R_{in}'}\right),$$

wherein $R_{in}'$ denotes an input impedance of the second impedance control line and $R_{in}$ denotes an input impedance of the first impedance control line; a first quarter wave transformer whose characteristic impedance $R_i$ satisfies the condition of "$R_{in}<R_i<R_{in\_out}$" or "$R_{in}<R_i<R_{in\_out}$" is located on the first impedance control line to match the input impedance $R_{in}$ of the first impedance control line to $R_{in\_opt}$, wherein $R_{in\_opt}$ denotes an optimum input impedance of the first amplifier; and a second quarter wave transformer whose characteristic impedance $R_i'$ satisfies the condition of "$R_{in}'<R_i'<R_{in\_opt}'$" or "$R_{in}'>R_i'>R_{in\_opt}'$" is located on the second impedance control line to match the input impedance $R_{in}'$ of the second impedance line to $R_{in\_opt}'$, wherein $R_{in\_opt}'$ denotes an optimum input impedance of the second amplifier.

In accordance with the present invention, the broadband power amplifier is advantageous in view of integration and miniaturization due to the low characteristic impedance of a quarter wave transformer and enables both reduction of sizes of chips and circuits due to its simple circuit structure and reduction in cost due to the reduced number of passive devices, by realizing a substantially two-section output matching circuit or a substantially two-section input matching circuit using the quarter wave transformer itself as the input matching circuit or the input matching circuit. Further, the broadband power amplifier enables improvement in the efficiency of a circuit by reducing the matching circuit loss of the entire circuit due to losses in passive devices.

In addition, the broadband power amplifier that is advantageous in view of efficiency and linearity can be operated over a wide range of frequencies and can be miniaturized and integrated.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, exemplary embodiments of the present invention will be described in detail with reference to the accompanying drawings.

Figure 6:
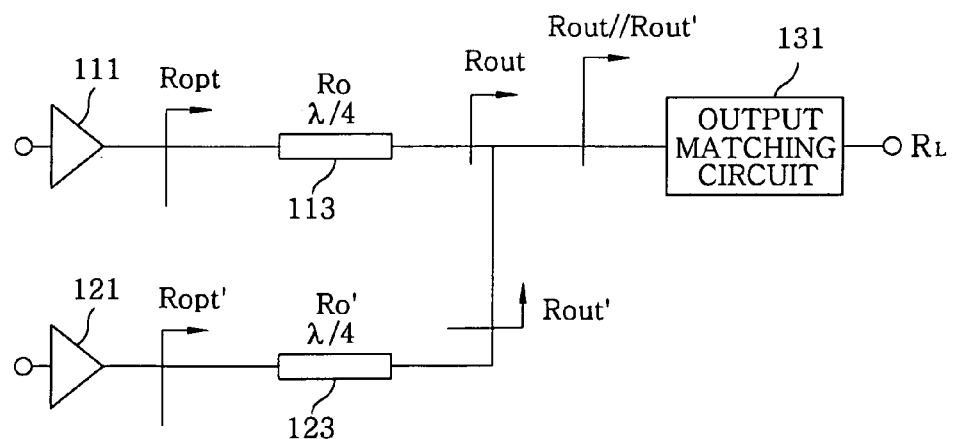
FIGS. 6 to 8 are circuit diagrams illustrating broadband power amplifiers in accordance with a first to third embodiments of the present invention.
Figure 7:
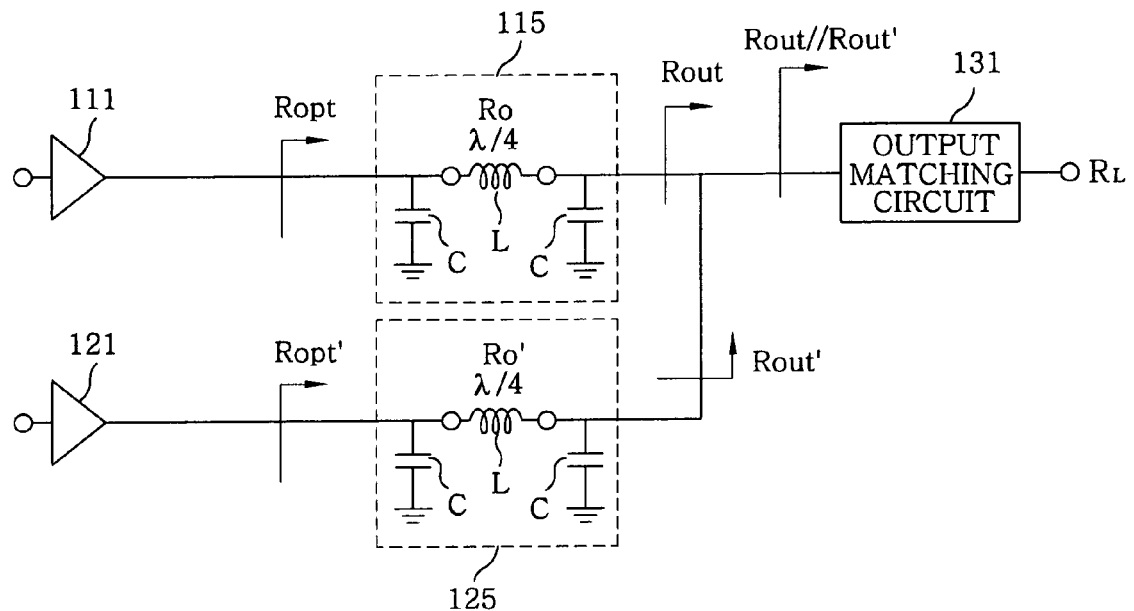
Figure 8:
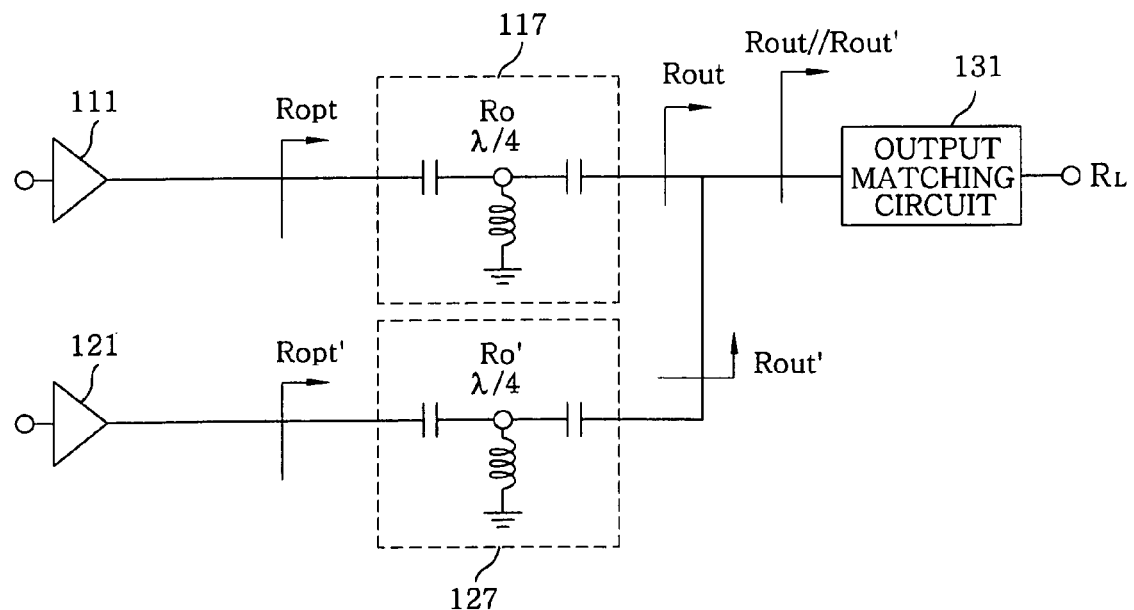

FIGS. 6 to 8 are circuit diagrams of broadband power amplifiers for output matching in accordance with a first to third embodiments of the present invention.

Referring first to FIG. 6, a broadband power amplifier according to the first embodiment of the present invention includes a first amplifier 111 and a second amplifier 121 that are connected in parallel, a first quarter wave transformer 113 connected to an output terminal of the first amplifier 111 to perform an output matching function through control of the load line impedance of the first amplifier 111, a second quarter wave transformer 123 connected to an output terminal of the second amplifier 121 to perform an output matching function through control of the load line impedance of the second amplifier 121, and an output matching circuit 131 connected to rear ends of the first quarter wave transformer 113 and the second quarter wave transformer 123.

According to the first embodiment of the present invention, the first and the second quarter wave transformers 113 and 123 includes first and second micro-strip lines, respectively. In addition, the first amplifier 111 and the second amplifier 121 may include a carrier amplifier and a peaking amplifier, respectively, or vice versa.

Referring to FIG. 7, a broadband power amplifier according to the second embodiment of the present invention is identical to that of the first embodiment, except that the quarter wave transformers are substituted with π-networks 115 and 125, respectively. Each of the π-networks 115 and 125 has an inductor-capacitor circuit having an inductor L and capacitors C. Although one inductor L and two capacitors C are employed to realize each π-network 115 and 125 in FIG. 7, two inductors L and one capacitor C may be employed to realize a π-network. For example, a capacitor C may be disposed at the locations of the inductors L of the π-network 115 and inductors L may be disposed at the locations of the capacitors C of the π-network 115.

Referring to FIG. 8, a broadband power amplifier according to the third embodiment of the present invention is identical to that of the first embodiment, except that the quarter wave transformers are substituted with T-networks 117 and 127, respectively. Each of the T-networks 117 and 127 has an inductor-capacitor circuit having an inductors L and a capacitor C. Although one inductor L and two capacitors C are employed to realize each T-network 115 and 125 in FIG. 8, two inductors L and one capacitor C may be employed to realize a T-network. For example, a capacitor C may be disposed at the locations of the inductors L of the T-network 117 and inductors L may be disposed at the locations of the capacitors C of the π-network 115.

Meanwhile, although the quarter wave transformers are realized by π-networks or T-networks in the embodiments of FIGS. 7 and 8, any circuits that ensure the characteristics of the quarter wave transformers using inductors and capacitors may be applied to a broadband power amplifier according to the present invention, instead of the π-networks and T-networks.

In order to help understand the operational characteristics of the respective broadband power amplifiers according to the first to third embodiments of the present invention, a broadband power amplifier will be described in detail with reference to FIG. 6 only.

A line connected in series to an output terminal of the first amplifier 111 functions as a first impedance control line, a line connected in series to an output terminal of the second amplifier 121 functions as a second impedance control line, and a line connecting in parallel the first impedance control line and the second impedance control line functions as an output line.

Assuming that $R_{opt}$ denotes an optimum power source impedance of the first amplifier 111, $R_{opt}'$, an optimum power source impedance of the second amplifier 121, $R_{out}$, an output impedance of the first impedance control line, and $R_{out}'$, an output impedance of the second impedance control line, an output matching circuit matching a load impedance to $R_{out} // R_{out}'$ $$\left( \text{where } R_{out} // R_{out}' = \frac{R_{out} \times R_{out}'}{R_{out} + R_{out}'} \right)$$

is located on the output line, and a first quarter wave transformer 113 whose characteristic impedance $R_o$ satisfies the condition of $R_{opt} < R_o < R_{out}$ or $R_{opt} > R_o > R_{out}$ is located on the first impedance control line to match the output impedance $R_{out}$ of the first impedance control line to $R_{opt}$.

A second quarter wave transformer 123 whose characteristic impedance $R_o'$ satisfies the condition of $R_{opt}' < R_o' < R_{out}'$ or $R_{opt}' > R_o' > R_{out}'$ is located on the second impedance control line to match the output impedance $R_{out}'$ of the second impedance line to $R_{opt}'$.

The broadband power amplifiers according to the first to third embodiments of the present invention are advantageous in integration and miniaturization due to their low characteristic impedances of the quarter wave transformers.

The quarter wave transformers, which include the micro-strip lines 113 and 123; the π-networks 115 and 125; or the T-networks 117 and 127, are employed in output matching circuits to realize substantially two-section output matching circuits, thereby widening the bandwidths of frequencies so as to acquire wide bandwidth characteristics. Further, the two-section output matching circuits are substantially the same as a single section output matching circuit in view of complexity and costs of the circuits and losses of the matching circuits.

Alternatively, one or more inductors L in the π-networks 115 and 125 and the T-networks 117 and 127 of the second embodiment may be realized by small inductors such as micro-strip lines or by bondwire inductors (for example, bonding wire inductors) essential for connection of MMIC chips to modules, in order to improve the complexity of the circuits, costs, and losses of the matching circuits.

Figure 9:
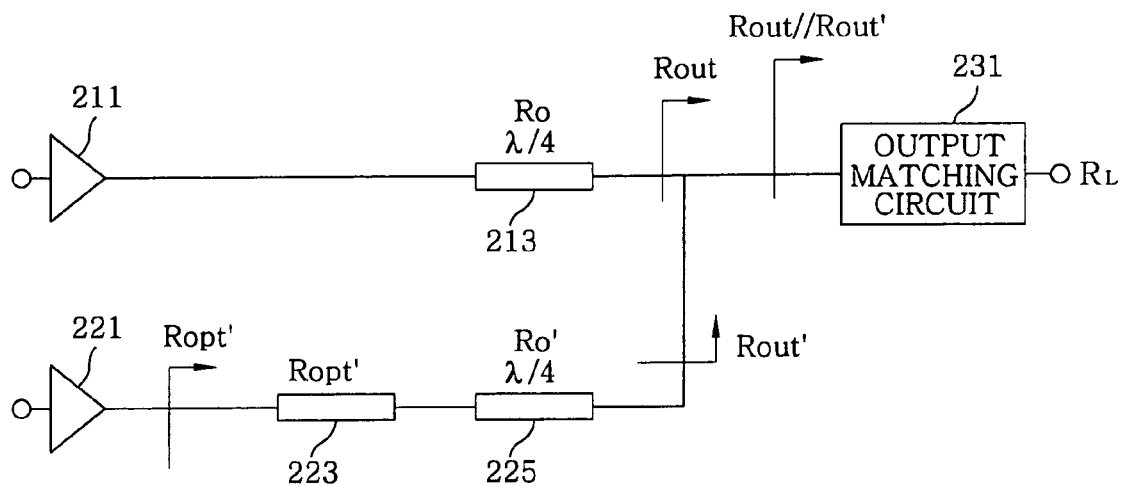
FIGS. 9 to 11 are circuit diagrams illustrating broadband power amplifiers in accordance with a fourth to sixth embodiments of the present invention.
Figure 10:
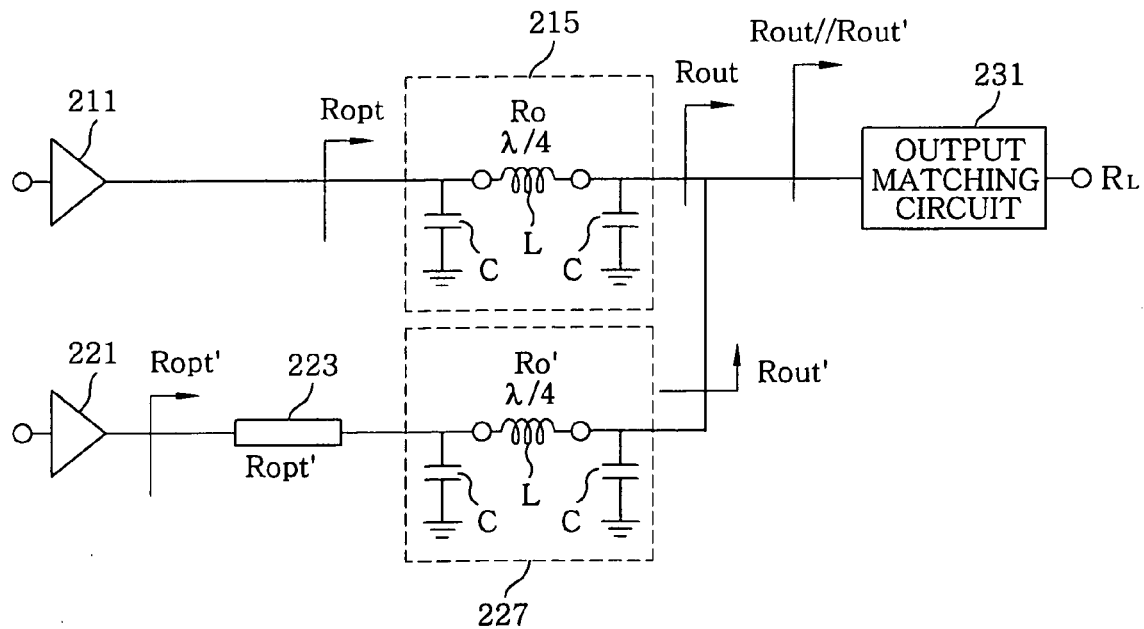
Figure 11:
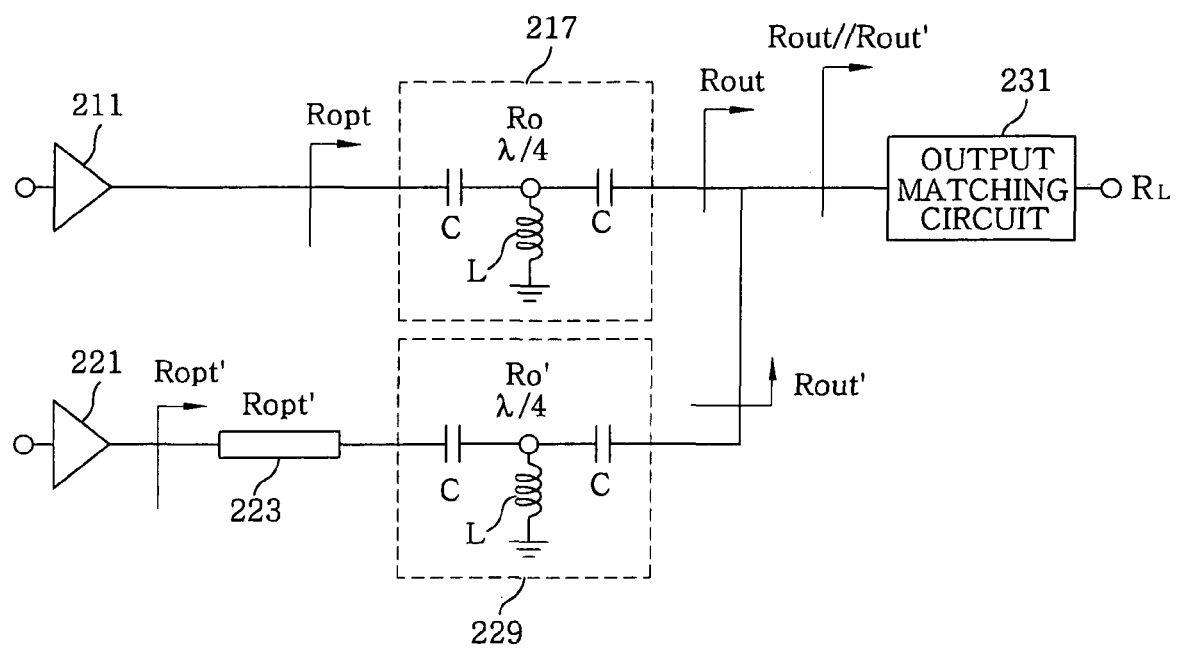

FIGS. 9 to 11 are circuit diagrams of broadband power amplifiers for output matching in accordance with fourth to sixth embodiments of the present invention.

Referring first to FIG. 9, a broadband power amplifier of the fourth embodiment includes a first amplifier 211 and a second amplifier 221 that are connected in parallel to induce a Doherty operation, a first quarter wave transformer 213 connected to an output terminal of the first amplifier 211 to perform an output matching function through control of the load line impedance of the first amplifier 211, and a second quarter wave transformer 225 connected to an output terminal of the second amplifier 221 to perform an output matching function through control of the load line impedance of the second amplifier 121. The broadband Doherty power amplifier of the fourth embodiment further includes an offset line 223 connected between the output terminal of the second amplifier 221 and the second quarter wave transformer 225 to make the output impedance to the second amplifier 221 sufficiently high as compared with an impedance of an output terminal and an impedance of the first amplifier 211, and an output matching circuit 231 connected to rear ends of the first quarter wave transformer 213 and the second quarter wave transformer 223.

According to the fourth embodiment of the present invention, the first and the second quarter wave transformers 213 and 225 include first and second micro-strip lines, respectively. In addition, the first amplifier 211 and the second amplifier 221 may include a carrier amplifier and a peaking amplifier, respectively, or vice versa.

Referring now to FIG. 10, a broadband power amplifier according to the fifth embodiment of the present invention is identical to that of the fourth embodiment, except that the quarter wave transformer are realized by π-networks 215 and 227, respectively. Each of the π-networks 215 and 227 includes an inductor-capacitor circuit having an inductor L and capacitors C. Although one inductor L and two capacitors C are employed to realize each π-network 215 and 227 in FIG. 10, two inductors L and one capacitor C may be employed to realize a π-network. For example, a capacitor C may be disposed at the locations of the inductors L of the π-network 215 and inductors L may be disposed at the locations of the capacitors C of the π-network 215.

Referring to FIG. 11, a broadband power amplifier according to the sixth embodiment of the present invention is identical to that of the fourth embodiment, except that the quarter wave transformer is realized with T-networks 217 and 229, respectively. Each of the T-networks 217 and 229 has an inductor-capacitor circuit having an inductor L and a capacitor C. Although one inductor L and two capacitors C are employed to realize each T-network 217 and 229 in FIG. 11, two inductors L and one capacitor C may be employed to realize a T-network. For example, a capacitor C may be disposed at the locations of the inductors L of the T-network 117 and inductors L may be disposed at the locations of the capacitors C of the T-network 217.

Meanwhile, although the quarter wave transformers are realized by π-networks or T-networks in the embodiments of FIGS. 10 and 11, any circuits that ensure the characteristics of quarter wave transformers using inductors and capacitors may be applied to a broadband power amplifier according to the present invention, instead of π-networks and T-networks.

In order to help understand the operational characteristics of the respective broadband power amplifiers according to the fourth to sixth embodiments of the present invention, the descriptions of the broadband power amplifiers will be made with reference to FIG. 9 only.

A line connected in series to an output terminal of the first amplifier 211 functions as a first impedance control line, a line connected in series to an output terminal of the second amplifier 221 functions as a second impedance control line, and a line connecting in parallel the first impedance control line and the second impedance control line functions as an output line.

Assuming that $R_{opt}$ denotes an optimum power source impedance of the first amplifier 211; $R_{opt}'$, an optimum power source impedance of the second amplifier 221; $R_{out}$, an output impedance of the first impedance control line; and $R_{out}'$; and an output impedance of the second impedance control line, an output matching circuit matching a load impedance to $R_{out}//R_{out}'$ is located on the output line, and a first quarter wave transformer 213 whose characteristic impedance $R_o$ satisfies the condition of $R_{opt}<R_o<R_{out}$ or $R_{opt}>R_o>R_{out}$ is located on the first impedance control line to match the output impedance $R_{out}$ of the first impedance control line to $R_{opt}$.

A second quarter wave transformer 225 whose characteristic impedance $R_o'$ satisfies the condition of $R_{opt}'<R_o'<R_{out}'$ or $R_{opt}'>R_o'>R_{out}'$ is located on the second impedance control line to match the output impedance $R_{out}'$ of the second impedance line to $R_{opt}'$.

The broadband power amplifiers according to the fourth to sixth embodiments of the present invention are advantageous in integration and miniaturization due to the low characteristic impedances of the quarter wave transformers, which may include the micro-strip lines 213 and 225; the π-networks 215 and 217; or T-networks 217 and 229.

The quarter wave transformers are employed in output matching circuits to realize substantially two-section output matching circuits, thereby widening the bandwidths of frequencies so as to acquire wide bandwidth characteristics. Further, the two-section output matching circuits are substantially the same as a single section output matching circuit in view of complexity and manufacturing costs of the circuits and losses of the matching circuits.

Alternatively, one or more inductors L in the π-networks 215 and 227 and the T-networks 217 and 229 of the fifth and sixth embodiments may be realized by small inductors such as micro-strip lines or by bondwire inductors (for example, bonding wire inductors) essential for connection of MMIC chips to modules, in order to improve the complexity of the circuits, costs, and losses of the matching circuits.

Figure 1:
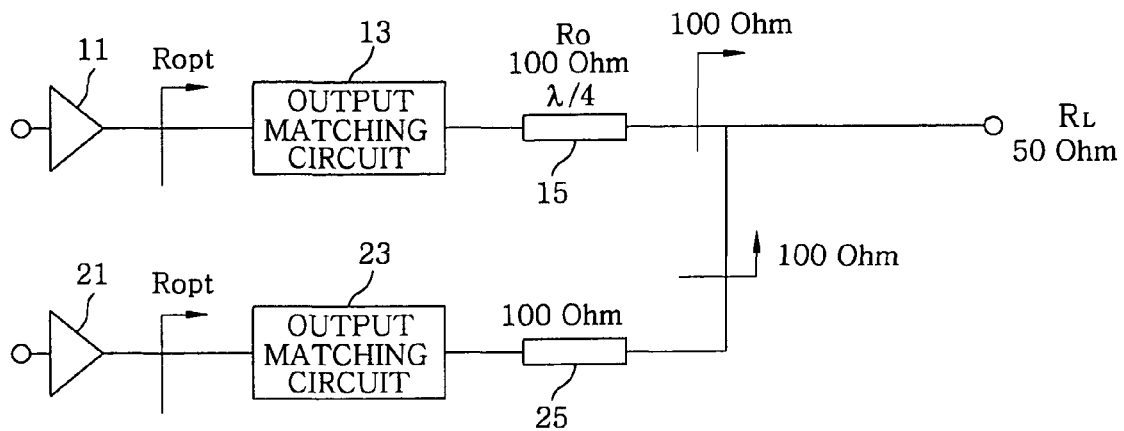
FIGS. 1 and 2 are circuit diagrams illustrating a first example of a Doherty power amplifier according to the prior art.
Figure 2:
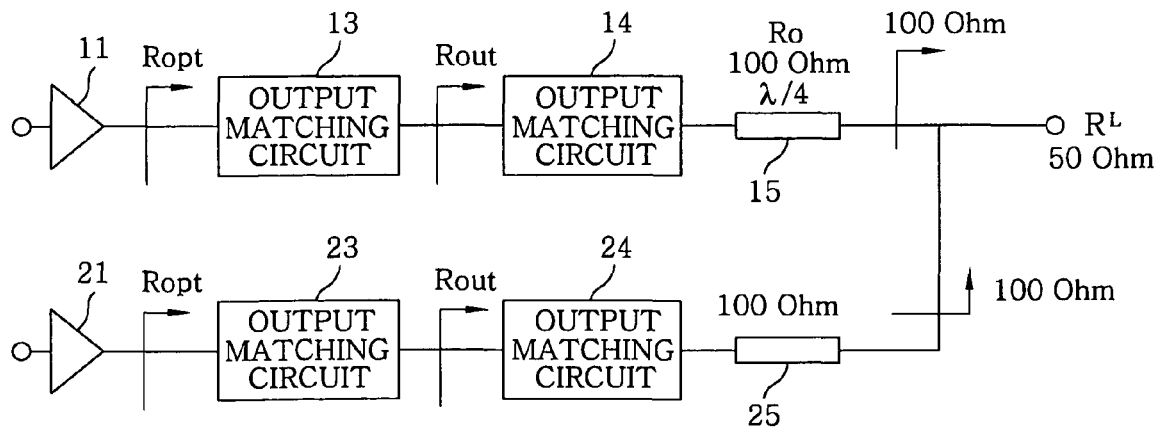
Figure 3:
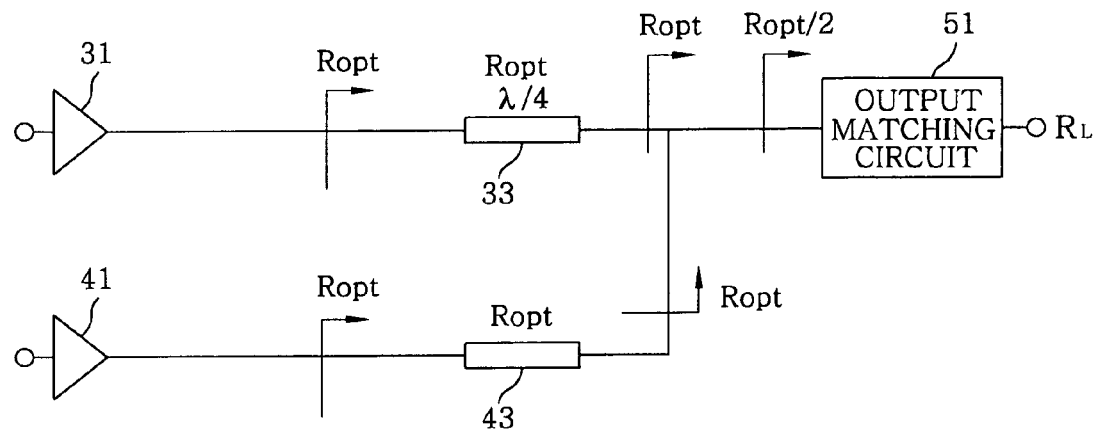
FIGS. 3 and 4 are circuit diagrams illustrating a second example of a Doherty power amplifier according to the prior art.

In the broadband Doherty power amplifier of the prior art that is illustrated in FIG. 3, when a load impedance $R_L$ is determined, impedance conversion (or impedance matching) for converting the impedance of $R_L$ to $R_{opt}/2$ needs to be carried out to the output matching circuit 51 in order to make the impedance viewed from the output terminals of the first amplifier 31 and the second amplifier 41 be $R_{opt}$.

In order to compare the broadband Doherty amplifier according to the fifth embodiment of the present invention to the aforementioned prior art, it is assumed that the impedance characteristics of the first amplifier and the second amplifier are the same in the broadband Doherty amplifier according to the fifth embodiment of the present invention that is illustrated in FIG. 10.

In the broadband power amplifier according to the fifth embodiment of the present invention, when a load impedance $R_L$ is determined, impedance conversion (or impedance matching) for converting the impedance of $R_L$ to $R_{out}/2$ needs to be carried out to the output matching circuit 231 in order to make the impedance viewed from the output terminals of the first amplifier 211 and the second amplifier 221 be $R_{opt}$. The reason why is that the π-networks 215 and 227 functioning as quarter wave transformers carry out conversion from the impedance of $R_{out}$ to $R_{opt}$.

In order to realize the impedance matching of the above-mentioned ratio, in the embodiments of the present invention, two-section matching is carried out. The matching ratios in the respective sections are $R_{opt}/2R_L$ in FIG. 3 and are $R_{out}/2R_L$ and $R_{opt}/R_{out}$ if $R_{opt}=R_{opt}'$ and $R_{out}=R_{out}'$ in FIG. 10. In general, the frequency characteristics in FIG. 10 are more excellent than in FIG. 3 due to the relationship of $R_{opt}<R_{out}<R_L$. The reason why is that, in designing a microcircuit, the frequency characteristics of an impedance matching circuit, i.e., the desired frequency range within which an impedance converter is operated becomes narrower as the matching ratio becomes larger.

Figure 4:
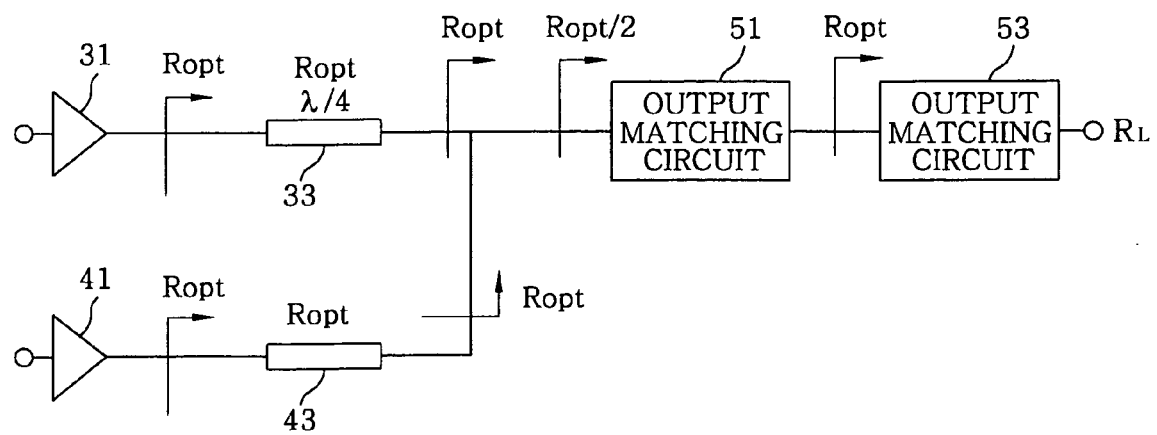
Figure 5:
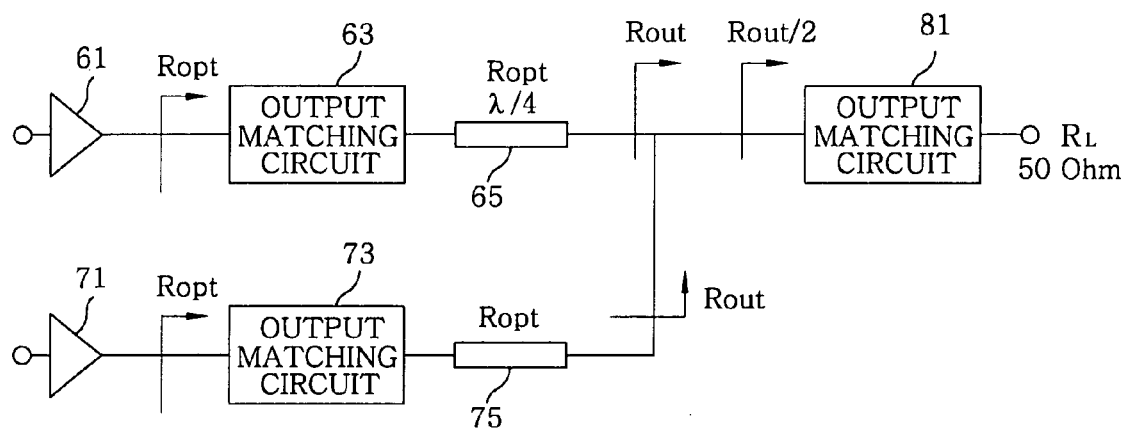
FIG. 5 is a circuit diagram illustrating a third example of a Doherty power amplifier according to the prior art.
Figure 12:
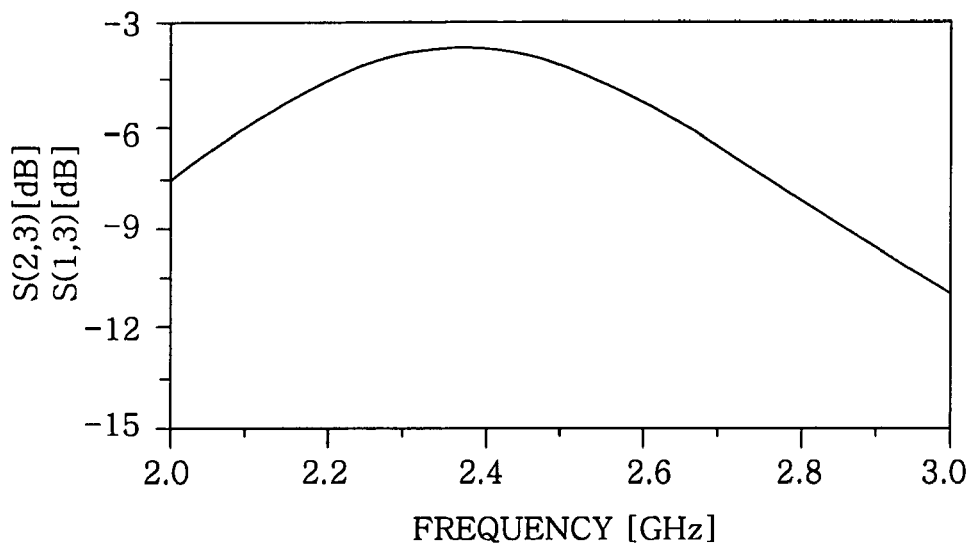
FIGS. 12 and 13 illustrate graphs representing frequency band characteristics of a Doherty power amplifier according to the prior art and a broadband power amplifier in accordance with the present invention, respectively, when load impedance is 50 ohm.
Figure 13:
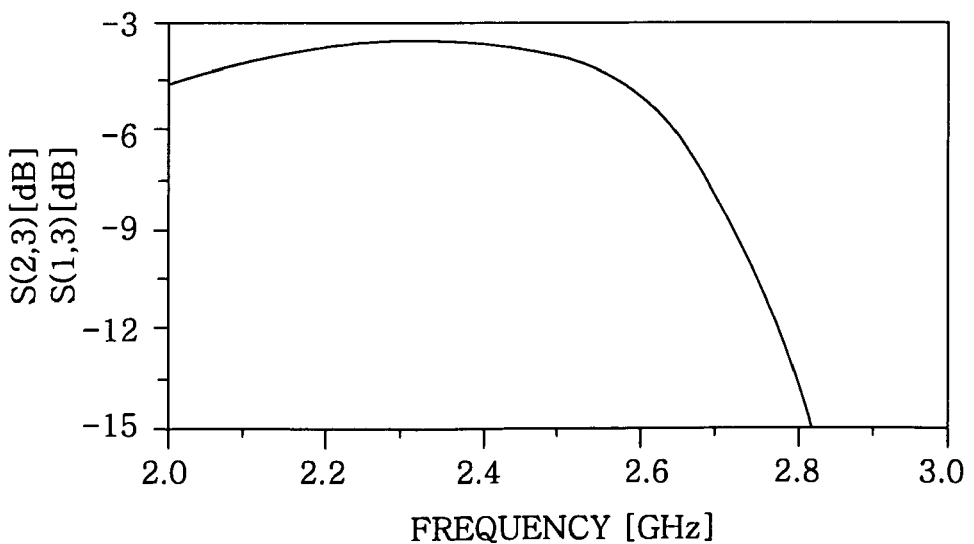

FIGS. 12 and 13 illustrate graphs representing frequency band characteristics of power amplifiers shown in FIG. 4 and FIG. 10, respectively. It can be seen, from the graphs illustrating simulation results of frequency characteristics of both power amplifiers, that the broadband power amplifier of FIG. 10 is more excellent than that of FIG. 4.

Meanwhile, in an RF circuit as in a power amplifier, the bandwidth of a frequency, in which the circuit is operated, is determined by a portion of the circuit where the ratio for impedance matching is largest. Therefore, it is necessary to pay attention to the impedance matching ratios of an input matching circuit and an internal matching circuit as well as an output matching circuit.

Figure 14:
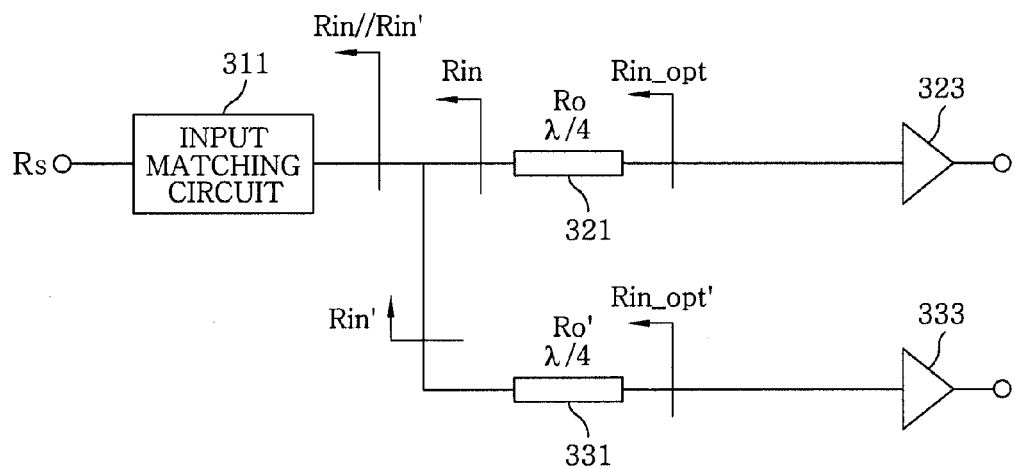
FIG. 14 is a circuit diagram illustrating a broadband power amplifier in accordance with a seventh embodiment of the present invention.

FIG. 14 is a circuit diagram illustrating a broadband power amplifier for input matching in accordance with a seventh embodiment of the present invention.

Referring first to FIG. 14, a broadband power amplifier according to the seventh embodiment of the present invention includes a first amplifier 323 and a second amplifier 333 that are connected in parallel, a first quarter wave transformer 321 connected to an output terminal of the first amplifier 323 to perform an output matching function through control of the load line impedance of the first amplifier 323, a second quarter wave transformer 331 connected to an input terminal of the second amplifier 333 to perform an input matching function through control of the load line impedance of the second amplifier 333, and an input matching circuit 311 connected to front ends of the first quarter wave transformer 321 and the second quarter wave transformer 331.

In the seventh embodiment, the first and the second quarter wave transformers 321 and 331 include first and second micro-strip lines, respectively. In addition, the first amplifier 323 and the second amplifier 333 may include a carrier amplifier and a peaking amplifier, respectively, or vice versa.

The impedance matching characteristic of the broadband power amplifier of the seventh embodiment will be described in detail.

A line connected in series to an input terminal of the first amplifier 323 functions as a first impedance control line, a line connected in series to an input terminal of the second amplifier 333 functions as a second impedance control line, and a line connecting in parallel the first impedance control line and the second impedance control line functions as an input line.

Assuming that $R_{in\_opt}$ denotes an optimum input impedance of the first amplifier 323; $R_{in\_opt}'$, an optimum input impedance of the second amplifier 333; $R_{in}$, an input impedance of the first impedance control line; and $R_{in}'$, an input impedance of the second impedance control line, an input matching circuit matching an input impedance to $R_{in}//R_{in}'$ is located on the input line, and the first quarter wave transformer 321 whose characteristic impedance $R_o$ satisfies the condition of $R_{in\_opt}<R_i<R_{in}$ or $R_{in\_opt}>R_i>R_{in}$ is located on the first impedance control line to match the input impedance $R_{in}$ of the first impedance control line to $R_{in\_opt}$.

The second quarter wave transformer 331 whose characteristic impedance satisfies the condition of $R_{in\_opt}'<R_i'<R_{in}'$ or $R_{in\_opt}'>R_i'>R_{in}'$ is located on the second impedance control line to match the output impedance $R_{out}'$ of the second impedance line to $R_{in}'$.

Alternatively, the quarter wave transformer 321 and 331 of the micro-strip lines may be realized by inductor-capacitor circuits such as π-networks and T-networks each having inductors L and capacitors C.

Moreover, one or more inductors L in the π-networks and the T-networks may be realized by small inductors such as micro-strip lines or by bondwire inductors (for example, bonding wire inductors) essential for connection of MMIC chips to modules, in order to improve the complexity of the circuits, costs, and losses of the matching circuits.

Figure 15:
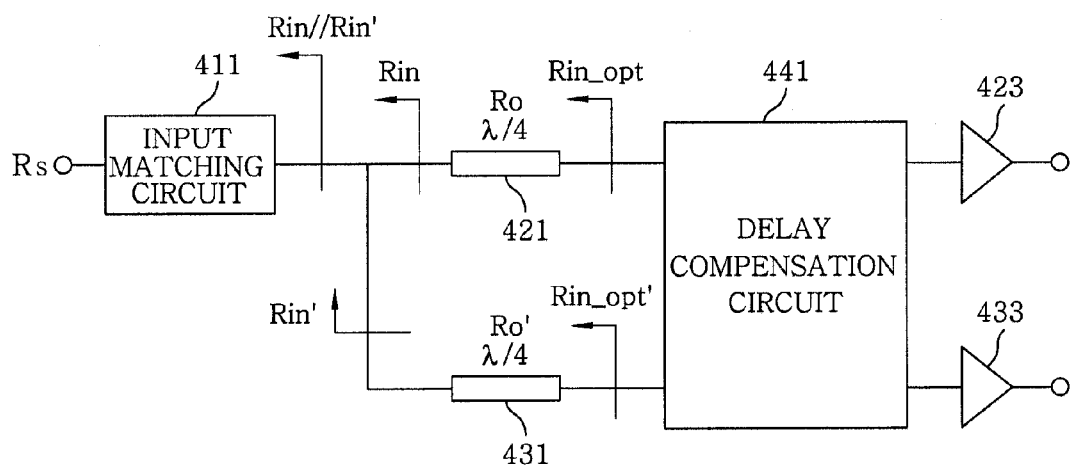
FIG. 15 is a circuit diagram illustrating a broadband power amplifier in accordance with an eighth embodiment of the present invention.

FIG. 15 is a circuit diagram illustrating a broadband power amplifier for input matching in accordance with an eighth embodiment of the present invention.

Referring to FIG. 15, a broadband power amplifier according to the eighth embodiment of the present invention includes a first amplifier 423 and a second amplifier 433 that are connected in parallel, a first quarter wave transformer 421 connected to an input terminal of the first amplifier 423 to perform an input matching function through control of the load line impedance of the first amplifier 423, and a second quarter wave transformer 431 connected to an input terminal of the second amplifier 433 to perform an input matching function through control of the load line impedance of the second amplifier 433, wherein the first and the second quarter wave transformers 421 and 431 include first and second micro-strip lines, respectively.

The broadband power amplifier according to the eighth embodiment further includes a delay compensation circuit 441 connected to one or all of a position between the first quarter wave transformer 421 and the first amplifier 423 and a position between the second quarter wave transformer 431 and the second amplifier 433 to compensate for a delay between the first amplifier 423 and the second amplifier 433, and an input matching circuit 411 connected to front ends of the first and the second quarter wave transformers 421 and 431.

The impedance matching characteristics of the broadband power amplifier of the eighth embodiment will be described. Here, the structure and wirings of the delay compensation circuit 441 are well known in the art, and thus the detailed description thereof will be omitted.

A line connected in series to an input terminal of the first amplifier 423 functions as a first impedance control line, a line connected in series to an input terminal of the second amplifier 433 functions as a second impedance control line, and a line connecting in parallel the first impedance control line and the second impedance control line functions as an input line.

In the eighth embodiment, the first amplifier 323 and the second amplifier 333 may include a carrier amplifier and a peaking amplifier, respectively, or vice versa.

Assuming that $R_{in\_opt}$ denotes an optimum input impedance of the first amplifier 423; $R_{in\_opt}'$, an optimum input impedance of the second amplifier 433; $R_{in}$, an input impedance of the first impedance control line; and $R_{in}'$, an input impedance of the second impedance control line, an input matching circuit 411 matching an input impedance $R_s$ to $R_{in}//R_{in}'$ is located on the input line, and a first quarter wave transformer 421 whose characteristic impedance $R_i$ satisfies the condition of $R_{in\_opt}<R_i<R_{in}$ or $R_{in\_opt}>R_i>R_{in}$ is located on the first impedance control line to match the input impedance $R_{in}$ of the first impedance control line to $R_{in\_opt}$.

A second quarter wave transformer 431 whose characteristic impedance $R_i'$ satisfies the condition of $R_{in\_opt}'<R_i'<R_{in}'$ is located on the second impedance control line to match the input impedance $R_{in}'$ of the second impedance line to $R_{in\_opt}'$.

Alternatively, the quarter wave transformers 421 and 431 may be realized by the inductor-capacitor circuits such as π-networks or T-networks.

Moreover, one or more inductors in the π-networks and the T-networks may be realized by small inductors such as microstrip lines or by bondwire inductors (for example, bonding wire inductors) essential for connection of MMIC chips to modules, in order to improve the complexity of the circuits, costs, and losses of the matching circuits.

While the invention has been shown and described with respect to the exemplary embodiments, it will be understood by those skilled in the art that the system and the method are only examples of the present invention and various changes and modifications may be made without departing from the scope of the invention as defined in the following claims.

What is claimed is:

1. A broadband Doherty power amplifier performing two-stage output matching, the amplifier comprising:
a carrier amplifier;
a peaking amplifier;
a first quarter wave transformer connected to an output terminal of the carrier amplifier;
a second quarter wave transformer connected to an output terminal of the peaking amplifier; and
an output matching circuit connected to rear ends of the first quarter wave transformer and the second quarter wave transformer,
wherein a front end of at least the first quarter wave transformer is directly connected only to the output terminal of the carrier amplifier and the rear end of the first quarter wave transformer is directly connected to the output matching circuit,
wherein the first quarter wave transformer and the second quarter wave transformer are connected in parallel to each other and cause a Doherty operation while serving as a first stage of the two-stage output matching,
wherein the output matching circuit serves as a second stage of the two-stage output matching,
wherein the first quarter wave transformer performs the output matching such that the load line impedance $R_{out}$ of the carrier amplifier is matched to an optimum power source impedance $R_{opt}$ of the carrier amplifier, and the second quarter wave transformer performs the output matching such that the load line impedance $R_{out}'$ of the peaking amplifier is matched to an optimum power source impedance $R_{opt}'$ of the peaking amplifier, the first quarter wave transformer having characteristic impedance $R_o$ satisfying the condition of $R_{opt}<R_o<R_{out}$ or $R_{opt}>R_o>R_{out}$ and the second quarter wave transformer having characteristic impedance $R_o'$ satisfying the condition of $R_{opt}'<R_o'<R_{out}'$ or $R_{opt}'>R_o'>R_{out}'$, and
wherein the output matching circuit matches a load impedance to $R_{out}//R_{out}'$ $$\left(\text{where } R_{out} // R_{out}' = \frac{R_{out} \times R_{out}'}{R_{out} + R_{out}'}\right).$$

2. The power amplifier of claim 1, further comprising an offset line connected between an output terminal of the peaking amplifier and the second quarter wave transformer.

3. The power amplifier of claim 1, wherein each of the first and the second quarter wave transformers includes a microstrip line or an inductor-capacitor circuit.

4. The power amplifier of claim 3, wherein the inductor-capacitor circuit includes a π-network or a T-network.

5. The power amplifier of claim 4, wherein one or more inductors in the inductor-capacitor circuit include a microstrip line or a bondwire inductor.

6. A broadband Doherty power amplifier performing two-stage input matching, the amplifier comprising:
a carrier amplifier;
a peaking amplifier;
a first quarter wave transformer connected to an input terminal of the carrier amplifier;
a second quarter wave transformer connected to an input terminal of the peaking amplifier; and
an input matching circuit connected to front ends of the first quarter wave transformer and the second quarter wave transformer,
wherein a rear end of the first quarter wave transformer is directly connected only to the input terminal of the carrier amplifier, a rear end of the second quarter wave transformer is directly connected only to the input terminal of the peaking amplifier, and the front ends of the first quarter wave transformer and the second quarter wave transformer are directly connected to the input matching circuit,
wherein the first quarter wave transformer and the second quarter wave transformer are connected in parallel to each other and cause a Doherty operation while serving as a first stage of the two-stage input matching,
wherein the input matching circuit serves as a second stage of the two-stage input matching,
wherein the first quarter wave transformer performs the input matching such that the input impedance $R_{in}$ of the carrier amplifier is matched to an optimum input impedance $R_{in\_opt}$ of the carrier amplifier, and the second quarter wave transformer performs the input matching such that the input impedance $R_{in}'$ of the peaking amplifier is matched to an optimum input impedance $R_{in\_opt}'$ of the peaking amplifier, the first quarter wave transformer having characteristic impedance $R_o$ satisfying the condition of $R_{in}<R_i<R_{in\_opt}$ or $R_{in}>R_i>R_{in\_opt}$ and the second quarter wave transformer has characteristic impedance satisfying the condition of $R_{in}'<R_i'<R_{in\_opt}'$ or $R_{in}'>R_i'>R_{in\_opt}'$, and
wherein the input matching circuit matches an input impedance to $R_{in}//R_{in}'$ $$\left(\text{where } R_{in} // R_{in}' = \frac{R_{in} \times R_{in}'}{R_{in} + R_{in}'}\right).$$

7. The power amplifier of claim 6, wherein each of the first and the second quarter wave transformer includes a microstrip line or an inductor-capacitor circuit.

8. The power amplifier of claim 7, wherein the inductor-capacitor circuit includes a π-network or a T-network.

9. The power amplifier of claim 7, wherein one or more inductors in the inductor-capacitor circuit includes a microstrip line or a bondwire inductor.

10. A broadband Doherty power amplifier performing two-stage input matching, the amplifier comprising:
a carrier amplifier;
a peaking amplifier;
a first quarter wave transformer connected to an input terminal of the carrier amplifier;
a second quarter wave transformer connected to an input terminal of the peaking amplifier;

an input matching circuit connected to front ends of the first quarter wave transformer and the second quarter wave transformer, and a delay compensation circuit connected to one or all of a position between the first quarter wave transformer and the carrier amplifier and a position between the second quarter wave transformer and the peaking amplifier to compensate for a delay between the carrier amplifier and the peaking amplifier, wherein a rear end of the first quarter wave transformer is directly connected only to one of the input terminal of the carrier amplifier and the delay compensation circuit, a rear end of the second quarter wave transformer is directly connected only to one of the input terminal of the peaking amplifier and the delay compensation circuit, and the front ends of the first quarter wave transformer and the second quarter wave transformer are directly connected to the input matching circuit, wherein the rear end of the first quarter wave transformer is connected only to the delay compensation circuit when the delay compensation circuit is connected between the first quarter wave transformer and the carrier amplifier, and the rear end of the second quarter wave transformer is connected only to the delay compensation circuit when the delay compensation circuit is connected between the second quarter wave transformer and the peaking amplifier, wherein the first quarter wave transformer and the second quarter wave transformer are connected in parallel to each other and cause a Doherty operation while serving as a first stage of the two-stage input matching, wherein the input matching circuit serves as a second stage of the two-stage input matching, wherein the first quarter wave transformer performs the input matching such that the input impedance $R_{in}$ of the carrier amplifier is matched to an optimum input impedance $R_{in\_opt}$ of the carrier amplifier, and the second quarter wave transformer performs the input matching such that the input impedance $R_{in}'$ of the peaking amplifier is matched to an optimum input impedance $R_{in\_opt}'$ of the peaking amplifier, the first quarter wave transformer having characteristic impedance $R_o$ satisfying the condition of $R_{in}<R_i<R_{in\_opt}$ or $R_{in}>R_i>R_{in\_opt}$ and the second quarter wave transformer has characteristic impedance satisfying the condition of $R_{in}'<R_i'<R_{in\_opt}'$ or $R_{in}'>R_i'>R_{in\_opt}'$, and wherein the input matching circuit matches an input impedance to $R_{in}//R_{in}//R_{in}'$ $$\left(\text{where } R_{in} // R_{in}' = \frac{R_{in} \times R_{in}'}{R_{in} + R_{in}'}\right).$$

11. The power amplifier of claim 10, wherein each of the first and the second quarter wave transformer includes a micro-strip line or an inductor-capacitor circuit.

12. The power amplifier of claim 11, wherein the inductor-capacitor circuit includes a π-network or a T-network.

13. The power amplifier of claim 11, wherein one or more inductors in the inductor-capacitor circuit includes a micro-strip line or a bondwire inductor.

* * * * *